United States Patent [19]
Sun

[11] Patent Number: 6,055,159
[45] Date of Patent: Apr. 25, 2000

[54] HEAT DISSIPATING MODULE FOR A HEAT GENERATING ELECTRONIC COMPONENT

[75] Inventor: Ming-Shen Sun, Taipei, Taiwan

[73] Assignee: Compal Electronics, Inc., Taipei, Taiwan

[21] Appl. No.: 09/377,746

[22] Filed: Aug. 20, 1999

[51] Int. Cl.$^7$ ...................................................... H05K 7/20
[52] U.S. Cl. .......................... 361/704; 361/707; 361/709; 361/710; 361/719; 165/80.3; 165/185; 174/16.3; 257/706; 257/707; 257/718; 257/719; 257/727
[58] Field of Search ..................................... 361/704, 707, 361/709, 710, 715, 719–721; 165/80.2, 80.3, 185; 174/16.3; 257/706, 707, 712, 713, 718, 719–722, 727

[56] References Cited

U.S. PATENT DOCUMENTS

| | | | |
|---|---|---|---|
| 5,302,853 | 4/1994 | Volz et al. | 257/707 |
| 5,754,400 | 5/1998 | Sathe et al. | 361/704 |
| 5,870,286 | 2/1999 | Butterbaugh et al. | 361/704 |
| 5,901,039 | 5/1999 | Dehaine et al. | 361/704 |
| 5,978,223 | 11/1999 | Hamilton et al. | 361/704 |

*Primary Examiner*—Leo P. Picard
*Assistant Examiner*—Boris L. Chervinsky
*Attorney, Agent, or Firm*—Pillsbury Madison & Sutro LLP

[57] ABSTRACT

A heat dissipating module is adapted for use with an electronic component on one side of a circuit board, and includes a heat sink having a contacting portion to be brought into contact with the electronic component, and a peripheral portion around the contacting portion and formed with a plurality of sink fastener holes that correspond respectively to board fastener holes formed in the circuit board around the electronic component. A back plate is to be disposed adjacent to the other side of the circuit board opposite to the electronic component, and is formed with a plurality of anchoring members that extend through the circuit board via the board fastener holes. Each of a plurality of spring-loaded fasteners has a shank portion, a curved hook portion that extends from the bottom end of the shank portion, and an operating portion that extends transversely from the top end of the shank portion. The shank portion of each fastener extends through a respective sink fastener hole, and the hook portion of each fastener extends through an anchor groove formed in a respective anchoring member for hooking thereon. Each fastener further has a biasing member for urging the heat sink to contact tightly the electronic component, and for ensuring tight engagement between the hook portion and the respective anchoring member.

5 Claims, 4 Drawing Sheets

6,055,159

HEAT DISSIPATING MODULE FOR A HEAT GENERATING ELECTRONIC COMPONENT

BACKGROUND OF THE INVENTION

1. Field of the Invention

The invention relates to a heat dissipating device, more particularly to a heat dissipating module for a heat generating electronic component, such as a central processing unit of a notebook computer.

2. Description of the Related Art

UPGA-type central processing units for new generation notebook computers have very stringent heat dissipating and circuit board mounting requirements. FIG. 1 illustrates a conventional heat dissipating module for a central processing unit 1 of a notebook computer. As shown, a computer main board 2 has a top side 21 provided with an integrated circuit socket 22 for establishing electrical connection with the central processing unit 1, and a mounting frame 23 that surrounds the socket 22. The heat dissipating module includes a heat dissipating plate 3, having an area larger than that of the frame 23, which is used to cover an open top of the frame 23 and to contact the central processing unit 1. The heat dissipating plate 3 has four corner portions formed with plate fastener holes 30. The frame 23 is formed with frame fastener holes 230 that correspond respectively with the plate fastener holes 30. As shown in FIG. 2, the main board 2 is formed with board fastener holes 24 that are aligned with the frame fastener holes 230. The heat dissipating module further includes a back plate 4 disposed below the main board 2 and formed with plate fastener holes 40 that correspond respectively with the board fastener holes 24. Four fastening bolts 41 are extended through aligned ones of the fastener holes 40, 24, 230, 30 from the bottom side of the main board 2, and engage threadedly a corresponding nut 42 above the heat dissipating plate 3, thereby fastening the back plate 4 and the heat dissipating plate 3 on the main board 2.

Because of the need to use fastening bolts 41 that are extended from the bottom side of the main board 2 and that engage corresponding nuts 42 above the heat dissipating plate 3, fastening of the back plate 4 and the heat dissipating plate 3 on the main board 2 not only requires the use of tools, but is also inconvenient and time-consuming to conduct. Moreover, in case an excessively large force was applied during the fastening operation, deformation of the main board 2 is likely to occur. Furthermore, while the mounting frame 23 around the socket 22 facilitates stable fastening of the heat dissipating plate 3 on the main board 2, the presence of the frame 23 increases the height and cost of the main board 2.

SUMMARY OF THE INVENTION

Therefore, the main object of the present invention is to provide a heat dissipating module, which can be easily and conveniently mounted on a circuit board, for dissipating the heat generated by an electronic component that is disposed on the circuit board.

Another object of the present invention is to provide a heat dissipating module which obviates the need for a mounting frame that surrounds the electronic component to lower the height and reduce the cost of the circuit board.

According to the present invention, a heat dissipating module is adapted to dissipate heat generated by an electronic component that is disposed on one side of a circuit board. The circuit board is formed with a plurality of angularly spaced board fastener holes around the electronic component. The heat dissipating module comprises a heat sink, a back plate and a plurality of spring-loaded fasteners.

The heat sink has a contacting portion adapted to be brought into contact with one side of the electronic component opposite to the circuit board, and a peripheral portion around the contacting portion and formed with a plurality of sink fastener holes that correspond respectively to the board fastener holes.

The back plate is adapted to be disposed adjacent to the other side of the circuit board opposite to the electronic component, and is formed with a plurality of anchoring members that are adapted to extend through the circuit board toward the heat sink via a respective one of the board fastener holes. Each of the anchoring members is formed with an anchor groove therethrough.

Each of the fasteners has a shank portion with top and bottom ends, a curved hook portion that extends from the bottom end of the shank portion, and an operating portion that extends transversely from the top end of the shank portion. The shank portion of each of the fasteners extends through a respective one of the sink fastener holes, and the curved hook portion of each of the fasteners extends through the anchor groove in a respective one of the anchoring members for hooking thereon. Each of the fasteners further has a biasing member provided on the shank portion for urging the heat sink to contact tightly the electronic component, and for ensuring tight engagement between the curved hook portion and the respective one of the anchoring members.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
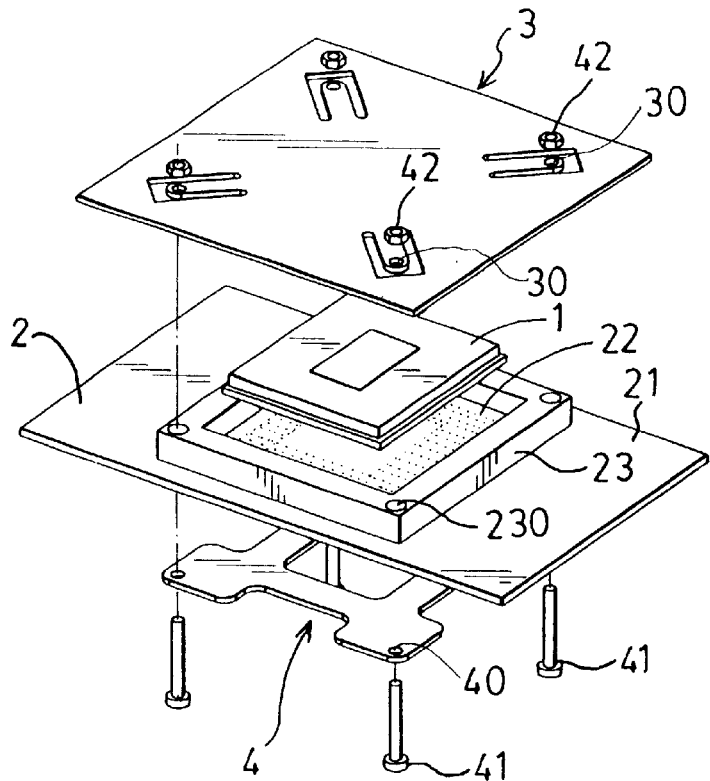
FIG. 1 is an exploded perspective view illustrating a conventional heat dissipating module for a central processing unit of a notebook computer.
Figure 2:
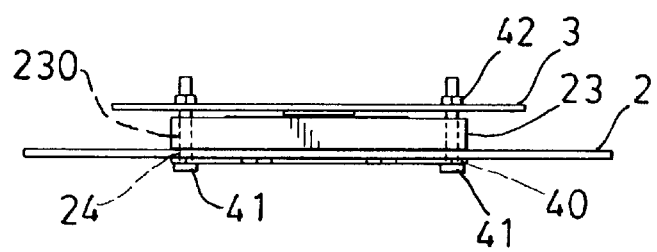
FIG. 2 is a schematic side view illustrating the conventional heat dissipating module of FIG. 1 in a state of use.
Figure 3:
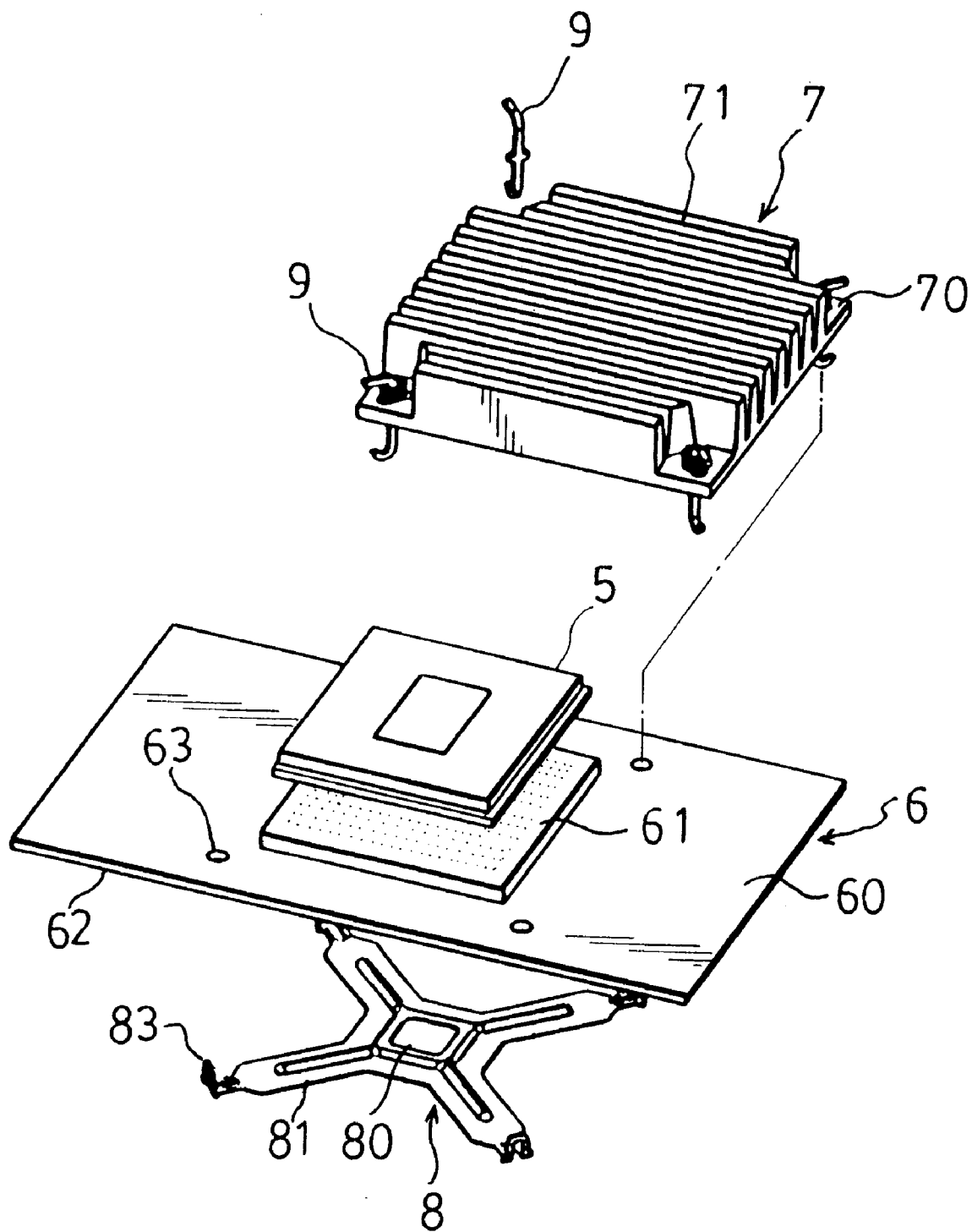
FIG. 3 is an exploded perspective view illustrating the preferred embodiment of a heat dissipating module for an electronic component according to the present invention.
Figure 4:
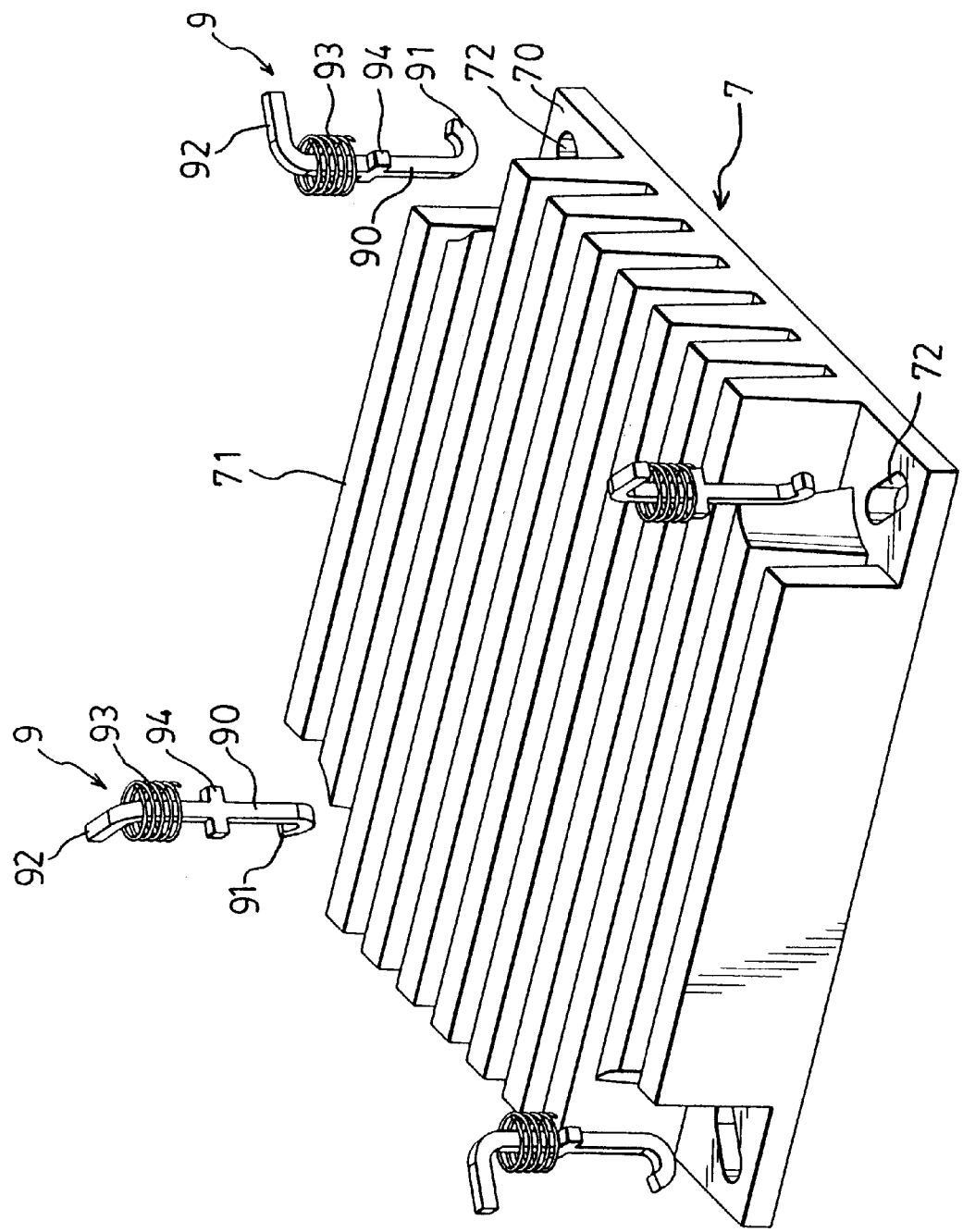
FIG. 4 is an exploded perspective view illustrating a heat sink and a plurality of spring-loaded fasteners of the preferred embodiment.
Figure 5:
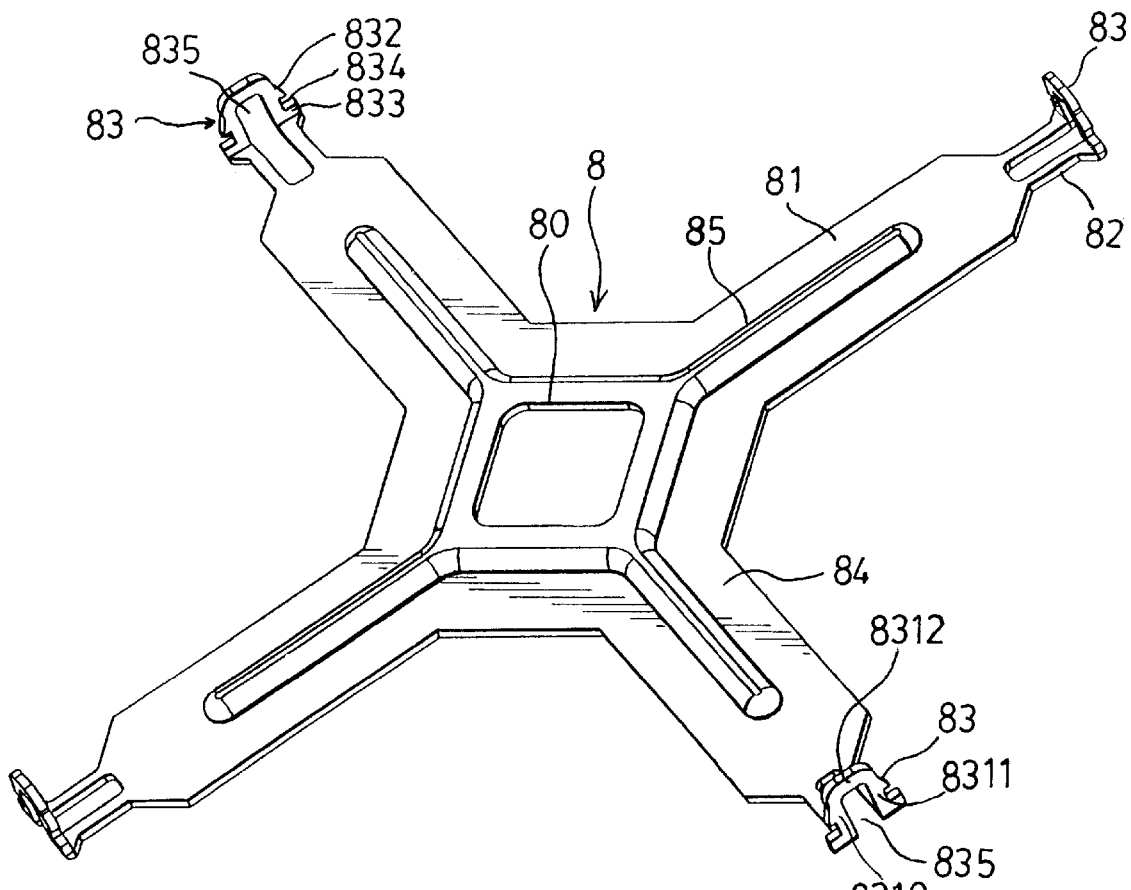
FIG. 5 is a perspective view illustrating a back plate of the preferred embodiment.
Figure 6:
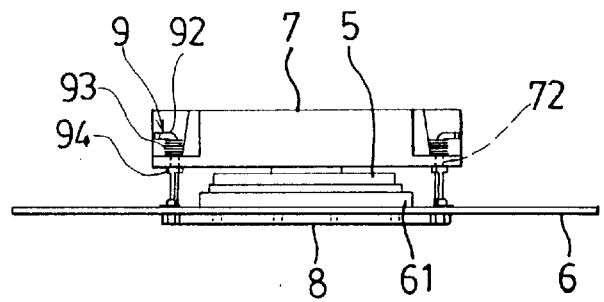
FIG. 6 is a schematic side view illustrating the preferred embodiment in a state of use.

Referring to FIG. 3, the preferred embodiment of a heat dissipating module according to the present invention is shown to be adapted for use with an electronic component, such as a central processing unit 5, to dissipate the heat that is generated thereby. The central processing unit 5 is disposed on an integrated circuit socket 61 that is provided on a top side 60 of a circuit board 6. The heat dissipating module includes a heat sink 7, a back plate 8 and a plurality of spring-loaded fasteners 9.

As shown in FIGS. 3 to 6, the heat sink 7 includes a base plate 70 and a plurality of parallel heat dissipating fins 71 that extend upwardly from the base plate 70. The base plate 70 has an area larger than that of the central processing unit 5, and includes a contacting portion to be brought into contact with a top side of the central processing unit 5, and a peripheral portion around the contacting portion and formed with four sink fastener holes 72 therethrough.

The back plate 8 is disposed adjacent to a bottom side 62 of the circuit board 6. The circuit board 6 is formed with four angularly spaced board fastener holes 63 that correspond respectively to the sink fastener holes 72. The back plate 8 includes a square-shaped central frame portion 80 and four elongate arm portions 81 that extend radially and outwardly from four corners of the frame portion 80 and that terminate at positions corresponding to the fastener holes 63, 72, respectively. Each arm portion 81 has a distal end 82 formed with an anchoring member 83 that extends upwardly therefrom. The anchoring member 83 is in the form of an inverted U, and includes a parallel pair of upright portions 8310, 8311 and a transverse portion 8312 that bridges distal top ends of the upright portions 8310, 8311. The upright portions 8310, 8311 and the transverse portion 8312 cooperate to confine a vertically extending anchor groove 835. Each of the upright portions 8310, 8311 is formed with upper and lower clamping projections 832, 833. The clamping projections 832, 833 are spaced apart vertically, and form a clamping groove 834 therebetween. The upper clamping projection 832 tapers upwardly. The vertical distance between the upper and lower clamping projections 832, 833 corresponds to the thickness of the circuit board 6. As such, when the anchoring members 83 are extended through the circuit board 6 via the board fastener holes 63, the portions of the circuit board 6 that define the fastener holes 63 extend into the clamping grooves 834 in the upright portions 8310, 8311, and the upper and lower clamping projections 832, 833 on the upright portions 8310, 8311 abut tightly against the top and bottom sides 61, 62 of the circuit board 6, thereby firmly retaining the back plate 8 on the circuit board 6. Preferably, each of the arm portions 81 has a top side 84 formed with a longitudinally extending reinforcing rib 85 that projects upwardly. Aside from enhancing the strength of the arm portions 81, the reinforcing ribs 85 reduce the contact area between the back plate 8 and the bottom side 62 of the circuit board 6.

Each of the fasteners 9 has a shank portion 90 with top and bottom ends, a curved hook portion 91 that extends integrally from the bottom end of the shank portion 90, and an operating portion 92 that extends transversely and integrally from the top end of the shank portion 90. When the shank portion 90 is extended through a respective one of the sink fastener holes 72 from the bottom side of the base plate 70 of the heat sink 7, the heat sink 7 is initially supported on lateral stop projections 94 formed on the shank portion 90. A biasing member 93, such as a coil spring, is subsequently sleeved on the shank portion 90 such that the opposite ends of the biasing member 93 press against the base plate 70 and the operating portion 92, respectively, thereby forcing the heat sink 7 against the stop projections 94. Thereafter, the heat sink 7 is disposed on top of the central processing unit 5. When the fasteners 9 are operated, such as by pressing the operating portions 92 downwardly, to enable the hook portions 91 thereof to extend through the anchor groove 835 and hook on the transverse portion 8312 of the respective one of the anchoring members 83, the heat sink 7 will be urged toward the circuit board 6 to establish tight contact with the central processing unit 5. At the same time, the biasing members 93 push the operating portions 92 upwardly to ensure tight engagement between the hook portions 91 and the anchoring members 83 and prevent untimely removal of the heat sink 7 from the circuit board 6.

Some of the advantages of the heat dissipating module of this invention are as follows:

1. The fastening operation is facilitated because spring-loaded fasteners 9 are used instead of fastening bolts when fastening the heat sink 7 and the back plate 8 on the circuit board 6.
2. Because no fastening bolts are in use, deformation of the circuit board 6 due to an excessively large applied force during the fastening operation can be avoided.
3. No mounting frame around the integrated circuit socket 61 is required, thereby lowering the height and reducing the cost of the circuit board 6.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A heat dissipating module adapted to dissipate heat generated by an electronic component that is disposed on one side of a circuit board, the circuit board being formed with a plurality of angularly spaced board fastener holes around the electronic component, said heat dissipating module comprising:

a heat sink having a contacting portion adapted to be brought into contact with one side of the electronic component opposite to the circuit board, and a peripheral portion around said contacting portion and formed with a plurality of sink fastener holes that correspond respectively to the board fastener holes;

a back plate adapted to be disposed adjacent to the other side of the circuit board opposite to the electronic component, said back plate being formed with a plurality of anchoring members that are adapted to extend through the circuit board toward said heat sink via a respective one of the board fastener holes, each of said anchoring members being formed with an anchor groove therethrough; and a plurality of spring-loaded fasteners, each of which has a shank portion with top and bottom ends, a curved hook portion that extends from said bottom end of said shank portion, and an operating portion that extends transversely from said top end of said shank portion, said shank portion of each of said fasteners extending through a respective one of said sink fastener holes, said hook portion of each of said fasteners extending through said anchor groove in a respective one of said anchoring members for hooking thereon, each of said fasteners further having a biasing member provided on said shank portion for urging said heat sink to contact tightly the electronic component, and for ensuring tight engagement between said hook portion and the respective one of said anchoring members.

2. The heat dissipating module as claimed in claim 1, wherein each of said anchoring members is formed with an upper clamping projection that is adapted to abut against said one side of the circuit board.

3. The heat dissipating module as claimed in claim 2, wherein each of said anchoring members is further formed with a lower clamping projection that is adapted to abut against said other side of the circuit board.

4. The heat dissipating module as claimed in claim 1, wherein said biasing member is a coil spring that presses against said operating portion and said heat sink.

5. The heat dissipating module as claimed in claim 1, wherein said back plate is formed with a plurality of reinforcing ribs that are adapted to contact said other side of the circuit board.

* * * * *